United States Patent
Ihm et al.

(10) Patent No.: US 11,243,178 B2
(45) Date of Patent: Feb. 8, 2022

(54) APPARATUS FOR ELECTRODELESS MEASUREMENT OF ELECTRON MOBILITY IN NANO MATERIAL, APPARATUS FOR ELECTRODELESS MEASUREMENT OF HOLE MOBILITY IN NANO MATERIAL, METHOD FOR ELECTRODELESS MEASUREMENT OF ELECTRON MOBILITY IN NANO MATERIAL, AND METHOD FOR ELECTRODELESS MEASUREMENT OF HOLE MOBILITY IN NANO MATERIAL

(71) Applicant: POSTECH ACADEMY-INDUSTRY FOUNDATION, Pohang-si (KR)

(72) Inventors: Kyu Wook Ihm, Pohang-si (KR); Mi Hyun Yang, Chungcheongnam-do (KR); Yong Jin Kim, Incheon (KR); Jung Sub Lee, Seoul (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 16/648,373

(22) PCT Filed: Sep. 20, 2018

(86) PCT No.: PCT/KR2018/011184
§ 371 (c)(1),
(2) Date: Mar. 18, 2020

(87) PCT Pub. No.: WO2019/059689
PCT Pub. Date: Mar. 28, 2019

(65) Prior Publication Data
US 2020/0225176 A1    Jul. 16, 2020

(30) Foreign Application Priority Data
Sep. 20, 2017  (KR) ........................ 10-2017-0121213

(51) Int. Cl.
| | | |
|---|---|---|
| *G01N 23/2251* | (2018.01) | |
| *G01N 23/227* | (2018.01) | |
| *H01J 37/073* | (2006.01) | |

(52) U.S. Cl.
CPC ....... *G01N 23/2251* (2013.01); *G01N 23/227* (2013.01); *H01J 37/073* (2013.01)

(58) Field of Classification Search
None
See application file for complete search history.

(56) References Cited

U.S. PATENT DOCUMENTS

| | | | | |
|---|---|---|---|---|
| 2007/0221845 A1* | 9/2007 | Komuro | ................ | H01J 37/268 250/310 |
| 2010/0301343 A1* | 12/2010 | Qiu | .................... | H01L 29/7869 257/66 |
| 2020/0225176 A1* | 7/2020 | Ihm | ...................... | G01N 23/227 |

FOREIGN PATENT DOCUMENTS

| | | |
|---|---|---|
| JP | 09-162253 | 6/1997 |
| JP | 09162253 A * | 6/1997 |

(Continued)

*Primary Examiner* — Andrew Smyth
(74) *Attorney, Agent, or Firm* — Lex IP Meister, PLLC

(57) ABSTRACT

A method for measuring electron mobility according to the present invention, which is performed by an apparatus comprising a chamber forming a sealed space, an electron gun provided in the chamber, and a metal sample disposed opposite to the electron gun in the sealed space, comprises: an electron irradiation step of irradiating the metal sample with electrons by the electron gun; a sample current measurement step of applying a voltage to the metal sample to measure a sample current obtained in the metal sample according to the applied voltage; a secondary electron current calculation step of calculating a secondary electron current through the measured sample current; and an effective incident current definition step of defining the sum of (Continued)

the measured sample current and the calculated secondary electron current as an effective incident current.

6 Claims, 9 Drawing Sheets

(56) References Cited

FOREIGN PATENT DOCUMENTS

| JP | 2002-286618 | 10/2002 |
| JP | 2007-257969 | 10/2007 |
| KR | 10-2000-0029046 | 5/2000 |
| KR | 10-2017-0140659 | 12/2017 |
| WO | 2016177493 | 11/2016 |

* cited by examiner

APPARATUS FOR ELECTRODELESS MEASUREMENT OF ELECTRON MOBILITY IN NANO MATERIAL, APPARATUS FOR ELECTRODELESS MEASUREMENT OF HOLE MOBILITY IN NANO MATERIAL, METHOD FOR ELECTRODELESS MEASUREMENT OF ELECTRON MOBILITY IN NANO MATERIAL, AND METHOD FOR ELECTRODELESS MEASUREMENT OF HOLE MOBILITY IN NANO MATERIAL

TECHNICAL FIELD

The present invention relates to a method for analyzing movement characteristics of charges or holes of a nano-electronic material, and more particularly, to a method for analyzing vertical movement characteristics of charges of a thin film material by omitting a part of a metal electrode and irradiating the surface of a sample with a particle beam including electrons, light, and the like.

BACKGROUND ART

Many studies and investments have been made by companies and organizations with regard to electronic materials used in electronic products that are essential for the daily life of modern people.

A significant portion of the important functions of electronic materials is related to the flow of charges, but until now, the main focus has been on understanding the planar moving line of current in the electronic materials.

However, with resistance switching devices with a sandwich structure and three-dimensional (3D) integration of the electronic materials receiving attention, characteristic information on charge movement in a vertical direction is a key concern for overcoming technical limitations in related fields and improving competitiveness.

In particular, as the thickness of a material becomes smaller in nanometer units, physical properties are more likely to be distorted due to the formation of metal electrodes, and thus vertical movement characteristics of electrons or holes of a nano-thin film are important in order to rapidly transfer electronic information of application materials.

In the case of 3D phase insulator samples that are being actively studied recently, when the samples are measured by a conventional electrode patterning method, there is a risk of breaking the physical properties of the samples due to the interaction between an electrode and the sample, and thus there is a need for a method for electrodeless measurement of the physical properties of the sample.

In addition, in the case of a resistive random-access memory (ReRAM) device that is spotlighted as a next-generation memory that may replace a conventional flash memory, there are many challenges that should be overcome for commercialization, and in order to solve these problems, it is essential to understand the change mechanism in vertical movement characteristics of charges of the material without a metal electrode.

Accordingly, the present invention overcomes this and applies the overcoming to a development stage of a material to analyze the vertical movement characteristics of a device and thus provides a method that may be utilized to understand real-time feedback of material properties and charge movement mechanics of the material.

DISCLOSURE

Technical Problem

The present invention has been made in view of the above-mentioned problems and is directed to providing a method for measuring the vertical movement characteristics of charges of a nanometer-sized ultra-thin sample, in which the effect of an electrode is eliminated.

The present invention is also directed to providing a method for analyzing vertical movement characteristics of charges of a thin film stacked structure.

Objectives of the present invention are not limited to the objectives described above, and the other objectives which are not described above will be clearly understood by those skilled in the art from the following specification.

Technical Solution

One aspect of the present invention provides a method for measuring electron mobility, which is performed by an apparatus including a chamber forming a sealed space, an electron gun provided in the chamber, and a metal sample provided in the sealed space to face the electron gun, the method including an electron irradiation step of irradiating the metal sample with electrons using the electron gun, a sample current measurement step of applying a voltage to the metal sample to measure a sample current according to the applied voltage on the metal sample, a secondary electron current calculation step of calculating a secondary electron current through the measured sample current, and an effective incident current definition step of defining the sum of the measured sample current and the calculated secondary electron current as an effective incident current.

The method may further include an electron mobility measurement step of measuring electron mobility in the metal sample using a value of the defined effective incident current and Equation 4, $$J_{EP}(\mu) = -1/(1-\delta_{EP}) \times \mu K_B T \nabla q / e \qquad \text{Equation 4}$$

where $J_{EP}$ is the effective incident current, $\mu$ is charge mobility, $\delta_{EP}$ is the number of secondary electrons generated by one electron per unit time, $K_B$ is a Boltzmann constant, $T$ is an absolute temperature, $\nabla q$ is a value obtained by differentiating charge distribution in the sample, and $e$ is a charge amount of the electron.

The secondary electron current calculation step may include obtaining data for secondary electron distribution according to kinetic energy by differentiating values of the measured sample current, calculating a schematic curve for distribution of the obtained data and selecting an equation from which a curve having a form similar to that of the calculated curve is derived, fitting a graph according to the derived equation into a curve for the distribution of the data, and obtaining secondary electron current data by integrating the fitted curve with the voltage.

Another aspect of the present invention provides a method for measuring hole mobility, which is performed by an apparatus including a chamber forming a sealed space, a photon supply unit provided in the chamber, and a metal sample provided in the sealed space to face the photon supply unit, the method including an electron irradiation step of irradiating the metal sample with photons through the photon supply unit, a sample current measurement step of applying a voltage to the metal sample to measure a sample current according to the applied voltage on the metal sample, a secondary electron current calculation step of calculating a secondary electron current through the measured sample current, and an effective incident current definition step of defining the sum of the measured sample current and the calculated secondary electron current as an effective incident current.

The method may further include a hole mobility measurement step of measuring hole mobility in the metal sample using a value of the defined effective incident current, $$J_{EP}(\mu) = -1/(1-\delta_{EP}) \times \mu k_B T \nabla q/e \qquad \text{Equation 4}$$

where $J_{EP}$ is the effective incident current, $\mu$ is charge mobility, $\delta_{EP}$ is the number of secondary electrons generated by one electron per unit time, $K_B$ is a Boltzmann constant, T is an absolute temperature, $\nabla q$ is a value obtained by differentiating charge distribution in the sample, and e is a charge amount of the electron.

The secondary electron current calculation step may include obtaining data for secondary electron distribution according to kinetic energy by differentiating values of the measured sample current, calculating a schematic curve for distribution of the obtained data and selecting an equation from which a curve having a form similar to that of the calculated curve is derived, fitting a graph according to the derived equation into a curve for the distribution of the data, and obtaining secondary electron current data by integrating the fitted curve with the voltage.

Still another aspect of the present invention provides an electron mobility measuring apparatus including a chamber forming a sealed space, an electron gun provided in the chamber and configured to irradiate the sealed space with an electron beam, a metal sample provided in the sealed space to face the electron gun, a voltage supply configured to apply a voltage to the metal sample, and a current measuring device configured to measure a current according to the voltage applied through the voltage supply.

The metal sample may include an active layer and an electrode located on a rear surface of the active layer, and the voltage supply and the current measuring device may be electrically connected to the electrode.

Yet another aspect of the present invention provides a hole mobility measuring apparatus including a chamber forming a sealed space, a photon supply unit provided in the chamber and configured to irradiate the sealed space with photons, a metal sample provided in the sealed space to face the photon supply unit, a voltage supply configured to apply a voltage to the metal sample, and a current measuring device configured to measure a current according to the voltage applied through the voltage supply.

The metal sample may include an active layer and an electrode located on a rear surface of the active layer, and the voltage supply and the current measuring device may be electrically connected to the electrode.

Advantageous Effects

An electrodeless analysis method of vertical movement characteristics of charges of a nano-electronic material of the present invention has the following effects.

First, an expensive electrode patterning process for analyzing movement characteristics of electrons or holes is not required, which can contribute to a reduction in material development cost and time.

Second, vertical movement characteristics of electrons or holes of a material can be simply analyzed just by adding a voltage application unit or a current measurement unit to an apparatus including a light source or an electron source.

Third, material properties can be grasped in real time by simultaneously measuring the electrical and chemical properties of a material, thereby providing information on the design of an electronic structure and on the development of customized materials using the same.

It should be noted that advantageous effects of the present invention are not limited to the above-described effects, and other effects that are not described herein will be apparent to those skilled in the art from the following descriptions.

MODES OF THE INVENTION

Hereinafter, exemplary embodiments of the present invention for specifically realizing the objectives of the present invention will be described with reference to the accompanying drawings. While describing the present embodiment, the same components are rendered with the same names and numerals, and additional descriptions thereof will be omitted.

An electrodeless analysis method of movement characteristics of electrons or holes of the present invention relates to a method for analyzing the vertical movement characteristics of electrons or holes of a sample through a value generated according to an applied voltage corresponding to a current generated by irradiating external electrons or light on the surface of a target material, that is, the sample.

In the conventional case, various methods, such as voltage-current characteristic analysis, field-effect charge mobility analysis, time of flight (TOF), space charge limited current (SCLC), Hall effect, and the like have been used to analyze movement characteristics of charges.

However, such a method causes physical damage to a metal sample and forms an interface with a material and thus has disadvantages of having unwanted effects such as surplus electrons and holes, interfacial voltages and capacitances, and the like.

In order to overcome such disadvantages, the present invention may omit an electrode, define an effective incident current by analyzing the phenomenon caused by irradiating photons or electron beams instead of injecting charges through the electrode, and through this, obtain vertical movement characteristics of electrons or holes of a material, which are related to the effective incident current.

Analysis Apparatus

Figure 1:
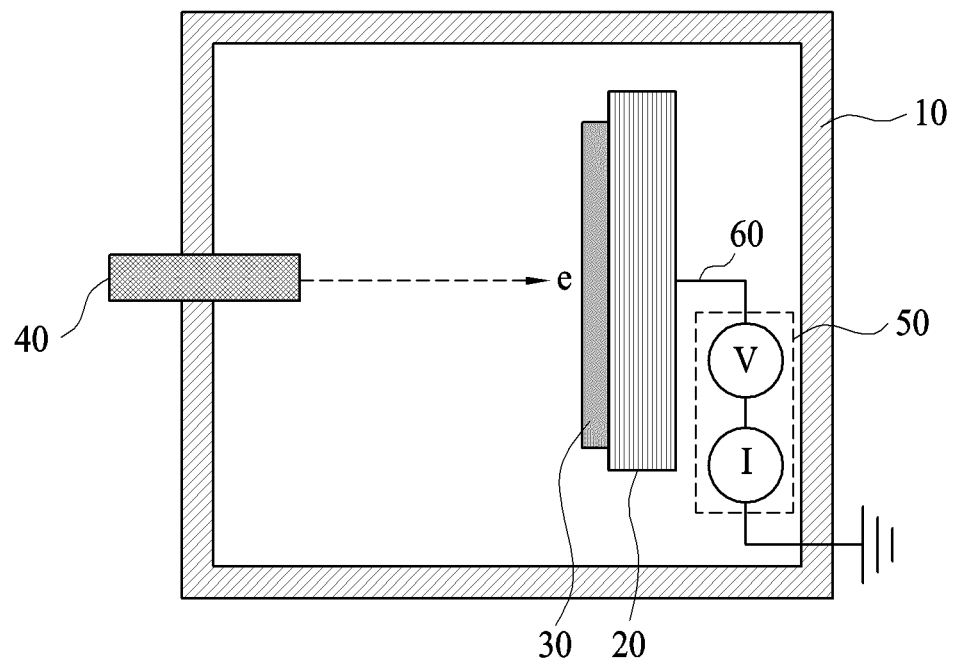
FIG. 1 is a view of an apparatus configured to perform an electrodeless charge injection method for analyzing charge movement of the present invention.

An apparatus for electrodeless measurement of electron mobility of the present invention will be described with reference to FIG. 1. FIG. 1 is a view of an apparatus for implementing the present invention.

An apparatus for electrodeless measurement of electron mobility of one embodiment of the present invention includes a chamber 10, an electron gun 40, a reference metal 20, a metal sample 30, and a circuit 60.

The chamber 10 forms a sealed space and refers to an area in which an experiment is performed. The chamber 10 is provided with the reference metal 20 that serves as a holder of the metal sample 30, a vacuum pump, the electron gun 40, and an I-V analyzer 50, and may be in an electrically grounded state.

The inside of the chamber 10 may be maintained in a high vacuum state through the vacuum pump. Since the inside of the chamber 10 is maintained in a high vacuum state, it is possible to prevent an electron beam from being scattered by air molecules and make energy have a constant value. In addition, the surface of the metal such as the reference metal 20 or the metal sample 30 may be prevented from being affected by air molecules or water vapor, thereby maintaining the physical properties of the metal.

In addition, the chamber 10 may be electrically connected to a ground state, thereby obtaining an accurate current signal. That is, an electrically neutral state may be maintained between the chamber 10 and the reference metal 20.

The electron gun 40 is provided in the chamber 10 and irradiates the reference metal 20 with an electron beam such that secondary electrons are generated from the reference metal 20 and the metal sample 30. That is, the surface of the metal is injected with an electron source to form the secondary electrons, and various types of kinetic energy may be selected according to the purpose.

The electron gun 40 may be made of the same material as the chamber 10, and thus, the present invention has the advantage in that a work function may be measured just by adding a voltage applying device and a current measuring device to a controller of the electron gun 40.

The the reference metal 20 is provided in the chamber to face the electron gun 40. The the reference metal 20 may serve to attach the metal sample 30, which will be described below, and may be provided with a very conductive metal.

Figure 2:
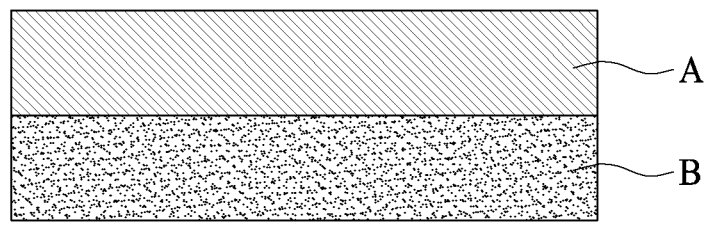
FIG. 2 is a cross-sectional view of a material for measuring charge movement adopted in the present invention.

The metal sample 30, which is a target of measurement, is examined with reference to FIG. 2. FIG. 2 is a cross-sectional view of a material for measuring charge movement.

"A" in FIG. 2 is a functional material that may be variously formed in resistance change, optics, sensor, or the like, and is an active layer having a single layer or multiple layers. In this case, "A" may be made of at least one of an organic material and an inorganic material.

Such an active layer may be manufactured through various methods such as spin coating, spray coating, electrostatic coating, dip coating, blade coating, inkjet coating, roll coating, thermal evaporation, and electron beam evaporation.

"B" in FIG. 2 is an electrode provided for electrical characteristics. Here, the electrode may be a transparent electrode, gold, silver, platinum, copper, cobalt, nickel, tin, aluminum, indium tin oxide, low resistance silicon wafer, or titanium.

The metal sample 30 is a measurement target for analyzing the movement characteristics of charges or holes, and the metal sample 30 may be located on a portion of the reference metal 20 at a position facing the electron gun 40.

Here, silver paste or carbon tape may be used to fix the metal sample 30 to the reference metal 20. However, in addition to the silver paste or the carbon tape, any material may be used without limitation as long as the metal sample can be fixed to the reference metal.

In addition, a position adjuster may be provided between the metal sample 30 and the reference metal 20, and upward, downward, leftward and rightward direction adjustments are possible through the position adjuster. This is for keeping the positions of the metal sample 30 and the reference metal 20, which are irradiated with the electron beam irradiated from the electron gun 40, constant. In other words, this is for maintaining the same position when the various metal samples 30 are measured.

Meanwhile, an apparatus for electrodeless measurement of hole mobility of the present invention is the same as the apparatus for electrodeless measurement of electron mobility described above except that the electron gun 40 is replaced with a photon supply unit.

The photon supply unit injects holes through photo-induced electron and electron-hole dipole formation on the surface of the sample. Here, various types of photon energy may be used in the photon supply unit according to the purpose thereof.

Analysis Method

Figure 3:
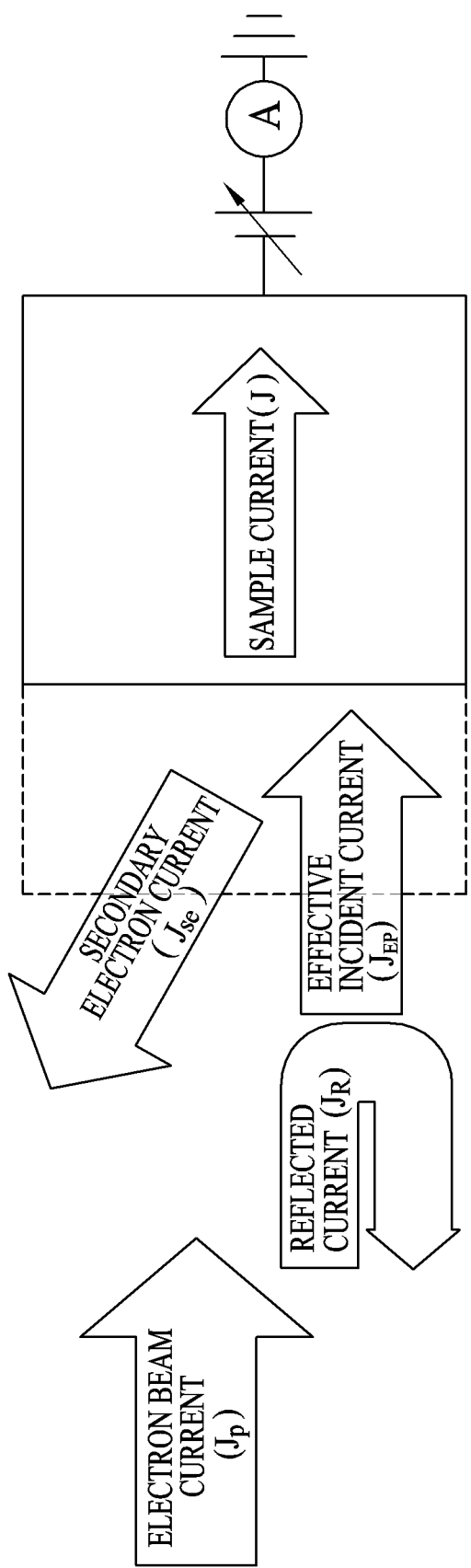
FIG. 3 is a schematic view illustrating the movement of electrons irradiated using an electron beam source of the present invention.

An electrodeless analysis method of vertical movement characteristics of electrons of the present invention will be described with reference to FIG. 3. FIG. 3 is a schematic view illustrating the movement of electrons irradiated using an electron beam source of the present invention.

The method for analyzing movement characteristics of charges of the present invention uses the analysis apparatus described above and includes an electron irradiation step, a sample current measurement step, a secondary electron current calculation step, an effective incident current definition step, and an electron mobility measurement step.

The electron irradiation step is a step of irradiating the metal sample 30 with an electron beam using the electron gun 40. As described above, this is a step of ionizing atoms by elastically colliding electrons, which have kinetic energy and are incident into the metal sample 30, with potential around the atoms constituting the metal sample 30.

Figure 4:
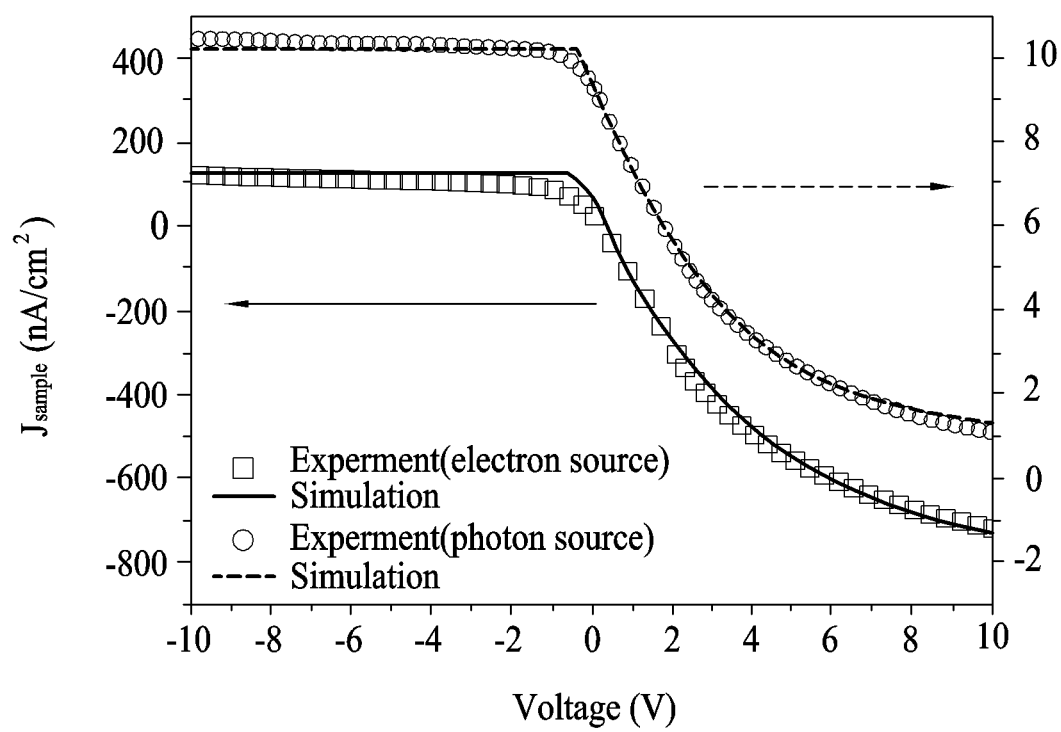
FIG. 4 is a graph illustrating a sample current (J) measured according to an applied voltage of the present invention.

The sample current measurement step is a step of applying a voltage to the metal sample 30 to measure a current value according to the voltage on the metal sample 30. Specifically, the current is measured through the I-V analyzer 50 while varying the applied voltage, and a graph of the current according to the applied voltage, as shown in FIG. 4, may be obtained as a result of the measurement, and the measured current is defined as a sample current J.

In the secondary electron current calculation step, a secondary electron current is calculated through the measured sample current.

The electrons, which have kinetic energy and are incident into the metal sample 30, elastically collide with the potential around the atoms constituting the sample. At this time, when the energy of the electrons is sufficiently great, electrons in a core level inside the atomic potential are transitioned and the atoms are ionized.

Through the above-described process, a back-scattered electron or secondary electron (SE) current may be generated, and electron-hole pairs may be generated, annihilated, or separated.

Figure 5:
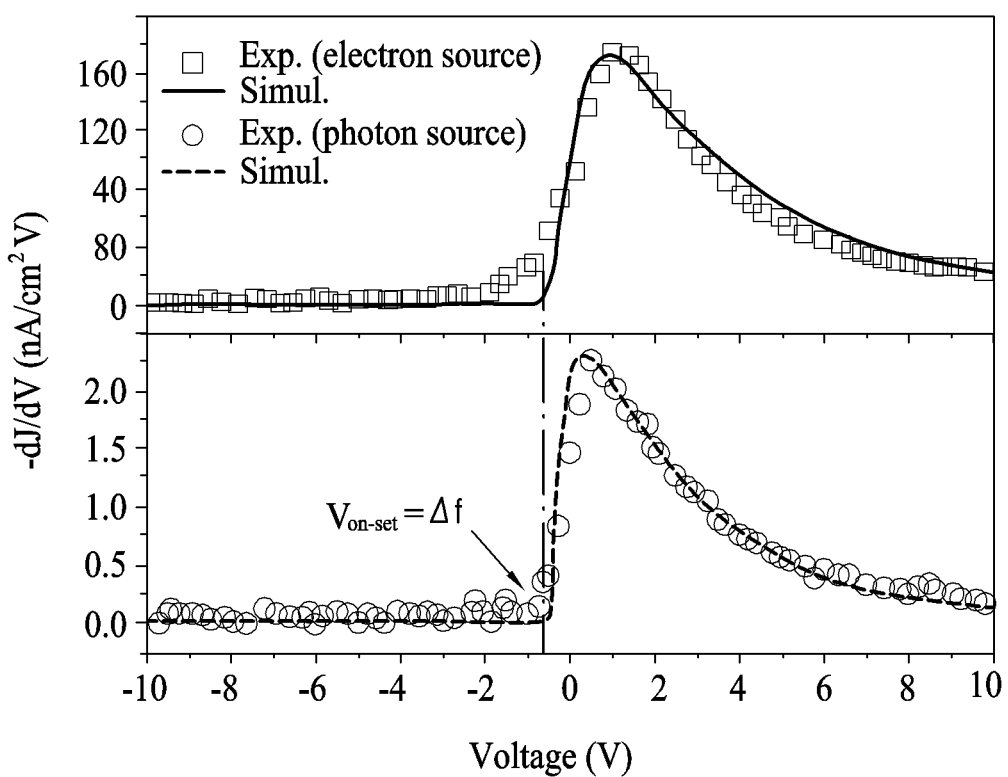
FIG. 5 is a graph illustrating a differentiated value of a sample current and a curve simulating the sample current in a process of obtaining a secondary electron current ($J_{se}$) through the measured sample current (J) of the present invention.

Specifically, as shown in FIG. 4, the measured sample current values are differentiated to obtain data for secondary electron distribution according to the kinetic energy, which is illustrated in FIG. 5. Then, a schematic curve for the distribution is calculated, and an equation is selected that draws a curve having a form similar to that of the calculated curve.

$$j_{se}(E_K) = nE_K \exp(-2\sqrt{E_K/m})$$

Figure 6:
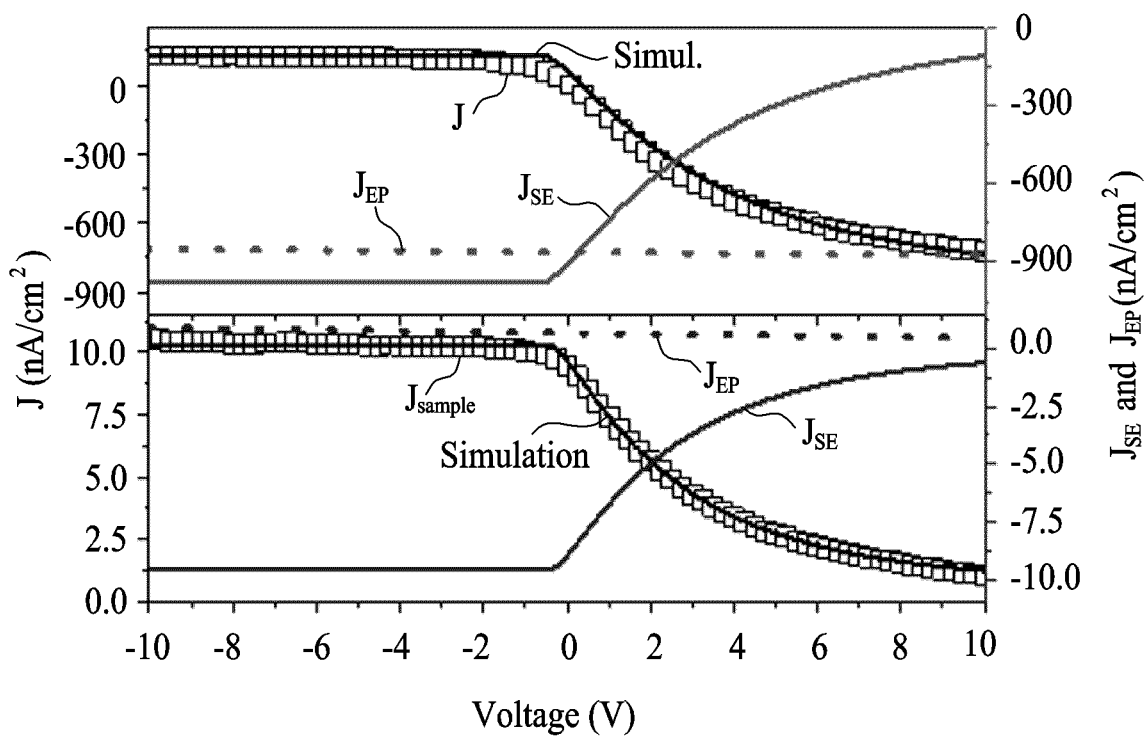
FIG. 6 is a graph illustrating values of the sample current (J), the secondary electron current ($J_{se}$), and an effective incident current ($J_{EP}$) obtained by summing the sample current (J) and the secondary electron current ($J_{se}$) of the present invention.

Fitting constants n and m for fitting data for the actual secondary electron distribution and a graph drawn through the selected equation are determined and then integrated with respect to an applied voltage V to obtain a secondary electron current $J_{se}$. The specific equation for this is as follows, where $\Delta\varphi$ is the difference between work functions of the active layer A and the electrode B. FIG. 6 is a view illustrating a graph of the secondary electron current $J_{se}$ obtained through the above-described process.

$$J_{SE}(V) = \int_{\Delta\varphi}^{\infty} j(E_k + V) dE_k$$

In the effective incident current definition step, the sum of the measured sample current J and the calculated secondary electron current $J_{se}$ is defined as an effective incident current $J_{EP}$.

That is, as can be seen in FIG. 3, according to the method for analyzing the charge movement characteristics of the present invention, the electrons irradiated by the electron beam source are not all incident due to scattering action or back scattering phenomenon with the sample.

In the case of a conventional measurement method using a method of injecting charges through an electrode, the effective incident current $J_{EP}$ has been understood as the amount of current that is externally determined and incident, that is, a value $J_P$ of energy irradiated through the electron beam.

However, in the method for electrodeless measurement of electron mobility according to the present invention, in which an electrode on one side is omitted, electrons $J_P$ irradiated through the electron gun 40 are classified into a reflected current $J_R$, the effective incident current $J_{EP}$ incident on the sample, the secondary electron current $J_{se}$ formed due to the scattering of electrons of the sample, and the sample current J formed in the sample due to the behavior of the remaining electrons after being scattered.

At this time, the effective incident current $J_{EP}$ is defined as the sum of the sample current J and the secondary electron current $J_{se}$, which is related to the vertical movement characteristics of charges of the metal sample. Thus, it is possible to understand the vertical movement characteristics of the charges by analyzing the effective incident current $J_{EP}$.

The relationship between the effective incident current $J_{EP}$ and the movement characteristics of the electrons of the metal sample in a vertical direction is as follows.

All systems with entry and exit of particles must satisfy Equation 1 which is a continuous equation. The present system may also perform physical analysis from a continuous equation.

$$\nabla \cdot J = -\frac{\partial \rho}{\partial t} \qquad \text{Equation 1}$$

In the present experimental system, the divergence of a charge amount at any local point in the sample into which the electron beam is incident is caused by the diffusion of the charges, and thus it is expressed as Equation 2 below.

$$\frac{\partial}{\partial x}\left\{-\frac{\mu K_B T}{e} \nabla q(x,t)\right\} = \partial \rho_{EP}(x,t)/\partial t - \partial \rho_{SE}(x,t)/\partial t \qquad \text{Equation 2}$$

where x is a thickness direction distance of the sample and has a value of 0 at the surface of the sample. The amount of charges generated per unit time at any one point x0 inside the sample may be expressed as $d\rho/dt = d\rho_h/dt + d\rho_e/dt = j_{EP}(x,t) - j_{SE}(x,t)$. Here, $j_{EP}(x,t)$ represents the density of charges incident on a position x at time t, and $j_{SE}(x,t)$ is the incident density of holes per time, which will be equal to the current density of secondary electrons generated per time. An incident charge density $j_{EP}(x,t)$ refers to an effective primary current density. In Equation 2, when both sides are integrated with respect to the sample thickness direction x, the following equation may be obtained.

$$-\mu K_B T \nabla q(x_0,V)/e = J_{EP} - J_{SE}(V) = J \qquad \text{Equation 3}$$

In Equation 3, J is a current flowing from the sample to the ground, $J_{EP}$ is the effective incident current, and $J_{SE}$ is a current due to the secondary electrons. Since the secondary electron current is proportional to an effective incident electron current incident on the sample, it may be expressed as $\delta_{EP} = J_{SE}/J_{EP}$, where $\delta_{EP}$ is the number of secondary electrons generated by one electron per unit time. Equation 3 is established when a CIPE system is in a steady state. At this time, even when the electron beam is injected on $SiO_2$ which is one insulating material, it takes no more than $10^{-4}$ seconds to reach a steady state.

When the charges continue to accumulate due to failure to reach the steady state, a local electric field of $10^7$ V/cm, at which a silicon material may be broken down, is formed in $10^{-2}$ seconds, which is less likely to occur [A. Miotello, M. Dapor, Phys. Rev. B. 56, 2241 (1997)].

Thus, in a similar system, most of which is in a steady state, even when the local physical state inside the sample is unknown, Equation 3 related to the conservation of the entry and exit of charges in the material is established, and at this point, the effective incident current may be expressed as follows.

$$J_{EP}(\mu) = -1/(1-\delta_{EP}) \times \mu K_B T \nabla q/e \qquad \text{Equation 4}$$

In the above-described equation, $\nabla q$ is a value obtained by differentiating the charge distribution, and a value of a corresponding material may be obtained from information obtained through a standard sample. At a specific voltage at which the secondary electrons do not escape from the material, of course, $\delta_{EP} = 0$, and here, charge mobility may be obtained from Equation 4.

Until now, there was no separate definition for the effective incident current $J_{EP}$ in the study of the similar system. Meanwhile, an initial beam source $J_P$ irradiated from the electron beam source is a fixed constant and incident on the material, and there has been a focus on studying the changes in the amount of current, which exits the material in various forms, due to the physical characteristics of the material. For example, the main focus was on how a scattering sectional area δ and a backscattering sectional area η of secondary electrons depend on electrical properties of a material. In all of these cases, $J_P$ is a fixed constant, and a Poisson equation is calculated together with Equation 3 under electrical characteristic values (dielectric constant, charge mobility, and trap density) of the material and calculated by additionally setting various electrical boundary conditions.

Figure 7:
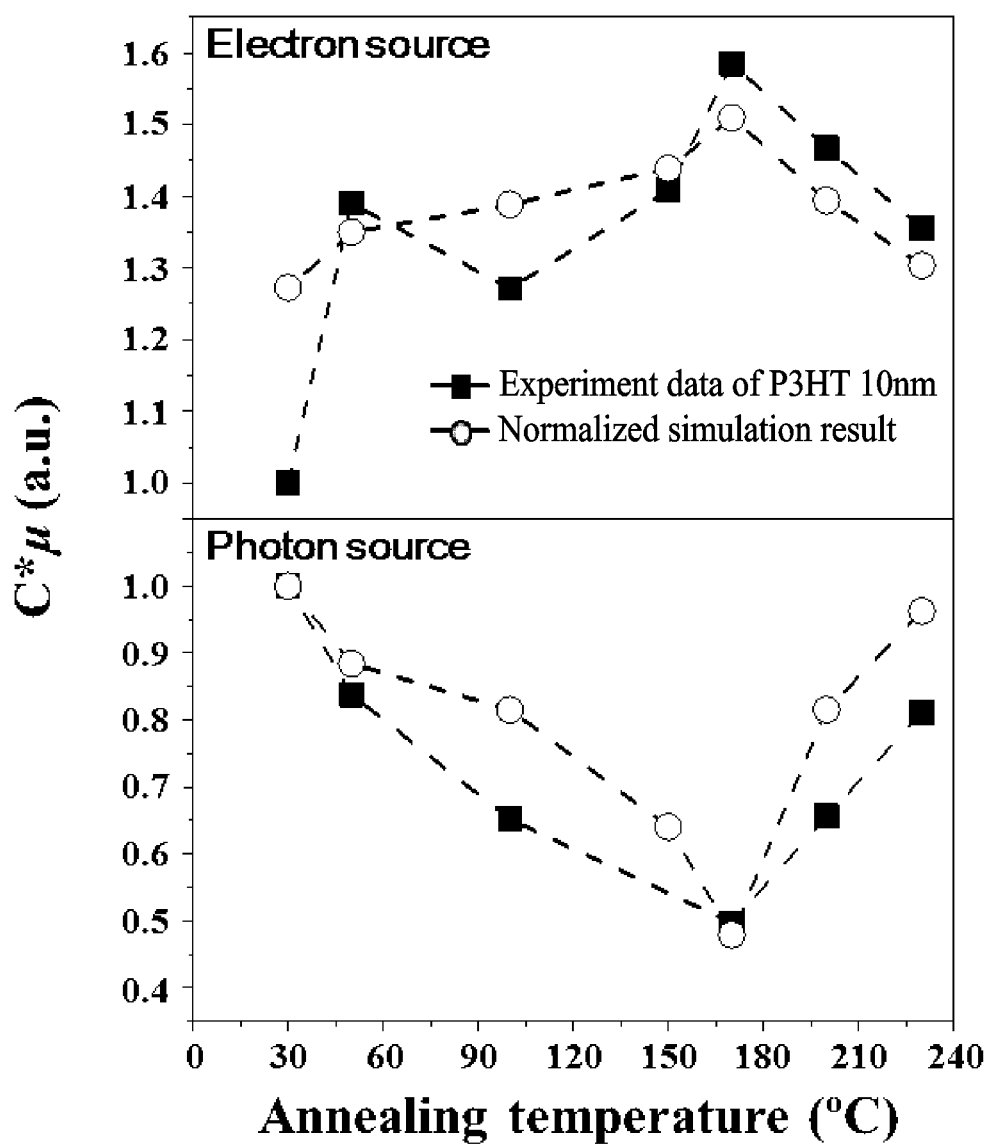
FIG. 7 is a graph comparing an effective incident current obtained experimentally according to an annealing temperature in an organic semiconductor sample P3HT (10 nm) by applying the present invention and an effective incident current obtained from theoretical results.

FIG. 7 is a graph comparing an effective incident current obtained experimentally according to an annealing temperature of an organic semiconductor sample P3HT (10 nm) by applying the present invention and an effective incident current obtained from the theoretical results.

Specifically, it is a graph comparing values of electron and hole mobilities measured through a relational equation proposed in the present invention for a length of an organic polymer P3HT of 10 nm and charge mobility calculated using a Gaussian 09w package. An x-axis is the crystallinity of the corresponding organic polymer.

It can be seen that the characteristics of the charge mobility calculated through the previously known method and the value of the charge mobility derived through the method proposed in the present invention are similarly derived as can be seen from the above illustrated graph.

In the conventional methods for measuring the movement characteristics of charges, since a metal electrode is deposited on a sample for the measurement, it was very difficult to measure intrinsic vertical movement characteristics of charges of a sample having a thin film of a nanometer thickness because metal atoms were caused to penetrate into the sample and interfacial properties were changed. Further, since it was difficult to obtain a uniform result because the difference in charge mobility values occurs according to device manufacturing conditions, it was difficult to obtain a result that matches a theoretical calculation. In the present invention, it was first confirmed that the experimental results of the movement characteristics of holes and electrons, which were obtained while changing the crystallinity of an organic semiconductor sample through a real-time annealing, were well matched with the results obtained through theoretical calculations. In the case of the organic sample, the movement of electrons is lowered due to a charge trap generated by oxygen in the sample, and it can be confirmed that when an electron source was used, the experimental results have differed from the theoretical calculations at 30 degrees, but after annealing at 50 degrees, oxygen inside the sample was reduced and the experimental results were well matched with the theoretical calculations.

Figure 8:
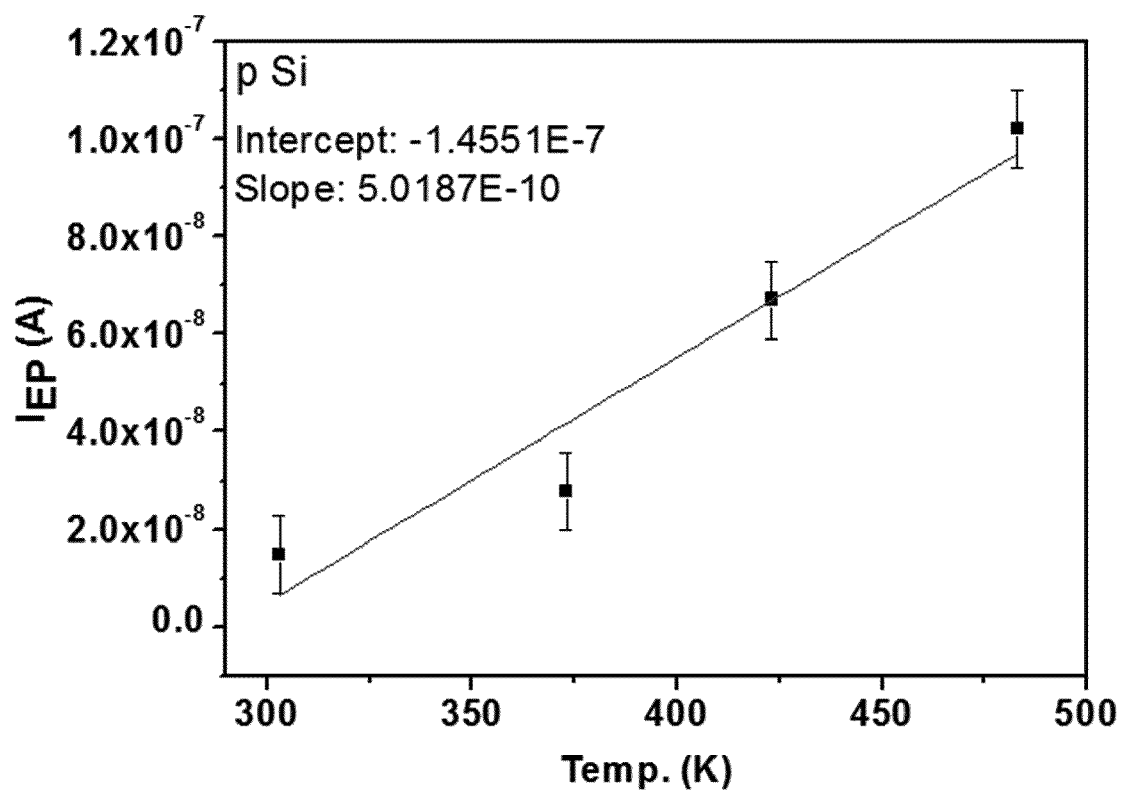
FIG. 8 is a graph illustrating an effective incident current according to a temperature obtained by measuring a p-type silicon substrate of the present invention.

FIG. 8 is a graph showing values of an effective incident current of a p-type silicon substrate according to a temperature.

In order to derive the graph of FIG. 8, the p-type silicon substrate was prepared as a sample to analyze the electrodeless movement characteristics of charges with respect to a resistance, and current characteristics were analyzed. The sample was prepared in a size of 5 mm×5 mm for the measurement. For the experiment, the chamber was maintained at a pressure of $3.7 \times 10^{-8}$ mbar, and the sample was irradiated with electrons (630 eV 1×1 mm$^2$).

Referring to FIG. 8, it may be seen that the values of an effective incident current IEP according to a temperature are shown and increase linearly. This is because the effective incident current is proportional to the diffusion current of the charges as described above. The diffusion current ($\mu K_B T/e$) of the sample is proportional to charge mobility, a Boltzmann constant, and an absolute temperature of the material. FIG. 5 demonstrates that the effective incident current has an amount proportional to the diffusion current by showing that the characteristics of the diffusion current are proportional to the temperature when the charge mobility of the material is constant.

Figure 9:
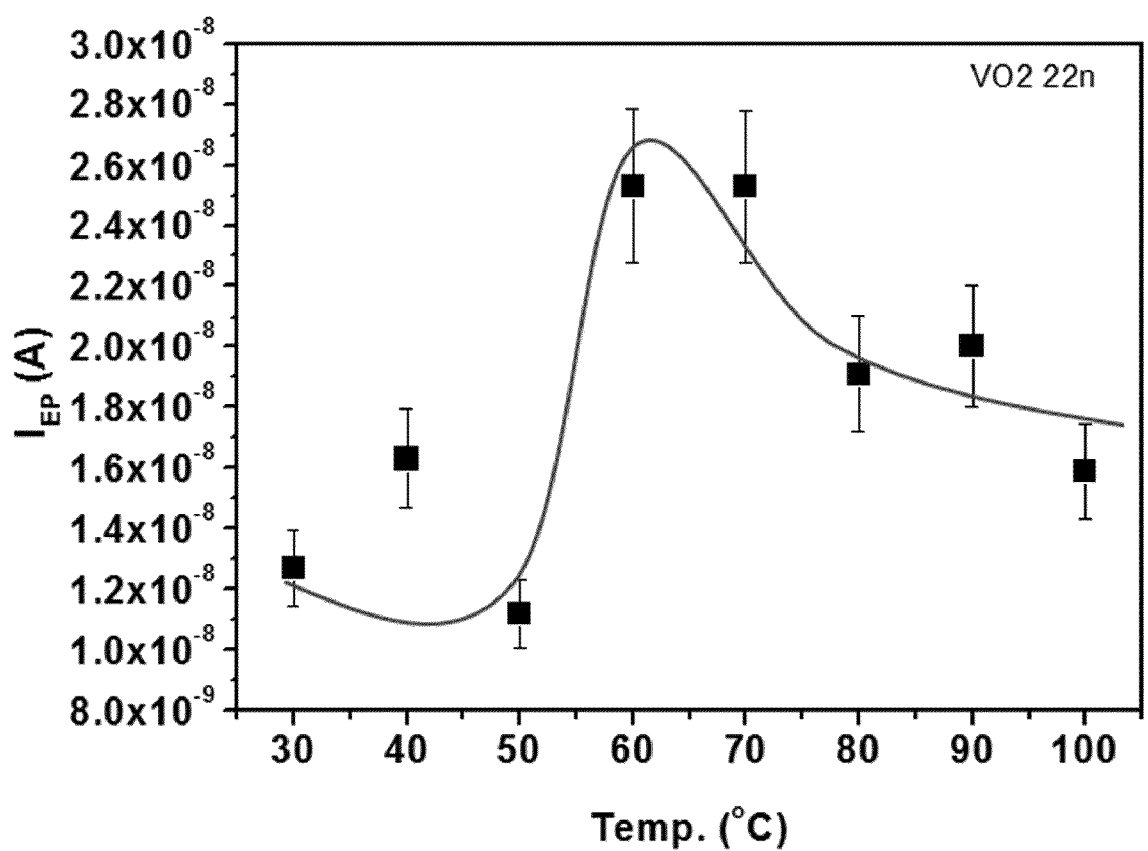
FIG. 9 is a graph illustrating a magnitude of an effective incident current according to a temperature of sample $VO_2$ (22 nm)/$Nb\_TiO_2$ (001) measured by applying the present invention.

FIG. 9 illustrates values of an effective incident current of a sample VO$_2$, which are obtained according to a temperature.

In order to derive the graph of FIG. 9, the sample was prepared as a thin film using VO$_2$, in which a metal-insulator phase transition occurs near room temperature, with TiO$_2$ doped with Nb having high charge mobility as a substrate. The sample was prepared in a size of 5 mm×5 mm for the measurement. For the experiment, the chamber was maintained at a pressure of $3.7 \times 10^{-8}$ mbar, and the sample was irradiated with electrons (630 eV 1×1 mm$^2$).

It has been previously demonstrated and described that the effective incident current is proportional to the vertical diffusion current of the charges. The charge movement characteristics of the sample VO$_2$ are known to be very difficult to measure. Hall mobility in a horizontal direction is mainly measured through a Hall effect measurement method, but the results reported in recent years are not matched with each other because the Hall mobility is very small and a Hall voltage is also very small due to high charge density [reference: Appl. Phys., 113, 043707 (2013), Phys. Rev. Lett., 115, 196401 (2015)]. The present case is a result of the first electrodeless measurement of changes in vertical charge mobility of a sample VO$_2$ having a thickness of 22 nm. Accordingly, the analysis of the movement characteristics of the electrons or holes at a specific point of the material is possible.

The exemplary embodiments of the present invention have been described as described above, and it will be clear to those skilled in the art that the present invention may be realized in a different specific form without departing from the spirit or scope of the present invention other than the above-described embodiments. Accordingly, the above-described embodiments should be considered in a descriptive sense only and not for purposes of limitation, and the present invention is not limited to the above description and may also be changed within the scope of the appended claims and all equivalents falling within the scope.

The invention claimed is:

1. A method for measuring electron mobility, which is performed by an apparatus comprising a chamber forming a sealed space, an electron gun provided in the chamber, and a metal sample provided in the sealed space to face the electron gun, the method comprising:
   an electron irradiation step of irradiating the metal sample with electrons using the electron gun;
   a sample current measurement step of applying a voltage to the metal sample to measure a sample current generated by the applied voltage on the metal sample;
   a secondary electron current calculation step of calculating a secondary electron current using the measured sample current;
   an effective incident current definition step of defining the sum of the measured sample current and the calculated secondary electron current as an effective incident current; and
   an electron mobility measurement step of measuring electron mobility in the metal sample using a value of the defined effective incident current and Equation 4, $$J_{EP}(\mu) = -1/(1-\delta_{EP}) \times \mu K_B T \nabla q/e \qquad \text{Equation 4}$$

where $J_{EP}$ is the effective incident current, $\mu$ is charge mobility, $\delta_{EP}$ is the number of secondary electrons generated by one electron per unit time, $K_B$ is a Boltzmann constant, T is an absolute temperature, $\forall q$ is a value obtained by differentiating charge distribution in the sample, and e is a charge amount of the electron.

2. The method of claim 1, wherein the secondary electron current calculation step includes obtaining data for secondary electron distribution according to kinetic energy by differentiating values of the measured sample current, calculating a schematic curve for distribution of the obtained data and selecting an equation representing a curve conforming to the calculated schematic curve, fitting a graph according to the selected equation into a curve for the distribution of the data, and obtaining secondary electron current data by integrating the fitted curve with the voltage.

3. A method for measuring hole mobility, which is performed by an apparatus comprising a chamber forming a sealed space, a photon supply unit provided in the chamber, and a metal sample provided in the sealed space to face the photon supply unit, the method comprising:
 a photon irradiation step of irradiating the metal sample with photons through the photon supply unit;
 a sample current measurement step of applying a voltage to the metal sample to measure a sample current generated by the applied voltage on the metal sample;
 a secondary electron current calculation step of calculating a secondary electron current using the measured sample current;
 an effective incident current definition step of defining the sum of the measured sample current and the calculated secondary electron current as an effective incident current; and
 a hole mobility measurement step of measuring hole mobility in the metal sample using a value of the defined effective incident current and Equation 4, $$J_{EP}(\mu) = -1/(1-\delta_{EP}) \times \mu K_B T \forall q/e \qquad \text{Equation 4}$$

where $J_{EP}$ is the effective incident current, $\mu$ is charge mobility, $\delta_{EP}$ is the number of secondary electrons generated due to one electron per unit time, $K_B$ is a Boltzmann constant, T is an absolute temperature, $\forall q$ is a value obtained by differentiating charge distribution in the sample, and e is a charge amount of the electron.

4. The method of claim 3, wherein the secondary electron current calculation step includes obtaining data for a secondary electron distribution according to kinetic energy by differentiating values of the measured sample current, calculating a schematic curve for distribution of the obtained data and selecting an equation representing a curve conforming to the calculated schematic curve, fitting a graph according to the selected equation into a curve for the distribution of the data, and obtaining secondary electron current data by integrating the fitted curve with the voltage.

5. An electron mobility measuring apparatus comprising:
 a chamber forming a sealed space;
 an electron gun provided in the chamber and configured to irradiate the sealed space with an electron beam;
 a metal sample provided in the sealed space to face the electron gun;
 a voltage supply configured to apply a voltage to the metal sample; and
 a current measuring device configured to measure a current generated by the voltage applied through the voltage supply,
 wherein
 the metal sample includes an active layer and an electrode located on a rear surface of the active layer, and
 the voltage supply and the current measuring device are electrically connected to the electrode.

6. A hole mobility measuring apparatus comprising:
 a chamber forming a sealed space;
 a photon supply unit provided in the chamber and configured to irradiate the sealed space with photons;
 a metal sample provided in the sealed space to face the photon supply unit;
 a voltage supply configured to apply a voltage to the metal sample; and
 a current measuring device configured to measure a current generated by the voltage applied through the voltage supply;
 wherein
 the metal sample includes an active layer and an electrode located on a rear surface of the active layer, and
 the voltage supply and the current measuring device are electrically connected to the electrode.

\* \* \* \* \*